United States Patent
Cai

(10) Patent No.: US 12,279,394 B2
(45) Date of Patent: Apr. 15, 2025

(54) PORTABLE STREAMING MEDIA PLAYER HOLDER

(71) Applicant: SHENZHEN DEONE INNOVATION TECHNOLOGY CO., LTD, Shenzhen (CN)

(72) Inventor: Jiongjun Cai, Shenzhen (CN)

(73) Assignee: SHENZHEN DEONE INNOVATION TECHNOLOGY CO., LTD, Shenzhen (CN)

( * ) Notice: Subject to any disclaimer, the term of this patent is extended or adjusted under 35 U.S.C. 154(b) by 232 days.

(21) Appl. No.: 18/313,506

(22) Filed: May 8, 2023

(65) Prior Publication Data

US 2024/0008209 A1 Jan. 4, 2024

(30) Foreign Application Priority Data

Jun. 29, 2022 (CN) .......................... 202221648903.7

(51) Int. Cl.
*H05K 7/14* (2006.01)
*H05K 5/02* (2006.01)
*H05K 5/03* (2006.01)

(52) U.S. Cl.
CPC .......... *H05K 7/1401* (2013.01); *H05K 5/0226* (2013.01); *H05K 5/03* (2013.01)

(58) Field of Classification Search
CPC ...... H05K 7/1401; H05K 5/0226; H05K 5/03; F16M 11/10; F16M 2200/027; F16M 11/38; F16M 13/022; F16M 11/041; G06F 1/1626; G06F 1/1632; H04M 1/04
See application file for complete search history.

(56) References Cited

U.S. PATENT DOCUMENTS

| | | | | |
|---|---|---|---|---|
| 5,584,457 A | * | 12/1996 | Fawcett ................. | F21V 23/04 362/802 |
| 8,967,561 B2 | * | 3/2015 | Cheng ................ | F16M 11/2014 248/176.1 |
| 10,253,926 B1 | * | 4/2019 | Fan ........................ | F21V 21/096 |
| 10,272,847 B1 | * | 4/2019 | Fan ........................ | B60N 3/004 |
| 11,473,601 B2 | * | 10/2022 | Fan .................... | F16M 11/2064 |
| 11,510,498 B1 | * | 11/2022 | Wu ........................ | F16M 11/10 |
| 2014/0130334 A1 | * | 5/2014 | Chun ..................... | F16M 13/00 248/122.1 |
| 2016/0095422 A1 | * | 4/2016 | Ralph ...................... | F16B 2/12 24/136 R |
| 2016/0230921 A1 | * | 8/2016 | Fan ...................... | F16M 11/105 |

* cited by examiner

*Primary Examiner* — Anthony M Haughton
*Assistant Examiner* — Hung Q Dang
(74) *Attorney, Agent, or Firm* — Daniel M. Cohn

(57) ABSTRACT

A portable streaming media player holder includes a first support, a second support, and a clamping mechanism. The first support and the second support are rotatably connected around a same axis. The second support is rotatably connected with the clamping mechanism. The first support includes a bottom shell, a cover plate, a sliding assembly, and a clamping plate. The cover plate is detachably or fixedly arranged on the bottom shell. The bottom shell is fixedly connected with the clamping plate. The sliding assembly is accommodated in a space formed by the bottom shell and the clamping plate. The sliding assembly is movably connected with the clamping plate. By the sliding assembly and the clamping plate, a user is able to hold the portable streaming media player holder with one hand and pull the sliding assembly with one finger to make the sliding assembly to slide.

20 Claims, 6 Drawing Sheets

PORTABLE STREAMING MEDIA PLAYER HOLDER

TECHNICAL FIELD

The present disclosure relates to a technical field of load-bearing bracket, and in particular to a portable streaming media player holder.

BACKGROUND

With continuous improvement of people's living standards and increasing material abundance, various kinds of streaming media players (e.g., cell phones, tablets, and laptops) have come to market. The streaming media players have various functions such as communication, surfing Internet, entertainment, playing games, etc., providing people with a very good experience in terms of using the streaming media players. With proliferation of the streaming media players, more and more holders matched with the streaming media players are created in the market.

A conventional streaming media player holder in the market generally comprises a pushing block arranged on a support thereof. The user needs to push the pushing block with a large force to open a clamping portion to clamp an object to be clamped by the support. Therefore, the conventional streaming media player holder of this type of structure is not friendly to the elderly whose hands are not flexible and those who have hand joint diseases. Meanwhile, when a user uses the conventional streaming media player holder of this type of structure, he/she generally needs to hold the conventional streaming media player holder with one hand and then uses the other hand to push the pushing block to open the clamping portion in order to clamp a streaming media player, which is time-consuming and laborious, so the conventional streaming media player holder is also not friendly to the user. Therefore, how to provide a convenient streaming media player holder capable of applying to different groups of people is a problem needed to be solved by those skilled in the art.

SUMMARY

In view of this, the present disclosure provides a portable streaming media player holder. By providing a sliding assembly and a clamping plate, a user is able to hold the portable streaming media player holder with one hand and pull the sliding assembly with one finger to make the sliding assembly to slide in a space formed by a bottom shell and the clamping plate, so that the portable streaming media player holder is able to release or clamp a streaming media player, which not only makes the portable streaming media player holder applicable to different groups of people, but also improves convenience of using the portable streaming media player holder.

The present disclosure provides the portable streaming media player holder. The portable streaming media player holder comprises a first support, a second support, and a clamping mechanism. The first support is rotatably connected with the second support. The first support and the second support rotate around a same axis. The second support is rotatably connected with the clamping mechanism. The first support comprises a bottom shell, a cover plate, a sliding assembly, and a clamping plate. The cover plate is detachably or fixedly arranged on the bottom shell. The bottom shell is fixedly connected with the clamping plate. The sliding assembly is accommodated in a space formed by the bottom shell and the clamping plate. The sliding assembly is movably connected with the clamping plate.

Furthermore, the sliding assembly comprises at least one spring, at least one guiding rod, a sliding piece, and at least one spring fixing shaft. The at least one guiding rod is inserted into the spring. At least one through hole running through the sliding piece from top to bottom is defined on the sliding piece. A first end of the at least one spring abuts against a bottom portion of the bottom shell. The at least one spring fixing shaft passes through the at least one through hole to abut against a second end of the at least one spring.

Furthermore, two ends of the cover plate are snapped on the bottom shell.

Furthermore, a first end of the cover plate is connected with the bottom shell by a pin, and a second end of the cover plate is snapped on the bottom shell.

Furthermore, the clamping plate and the bottom shell are fixedly connected through fasteners.

Furthermore, the clamping plate is welded to the bottom shell.

Furthermore, the clamping plate is reverted to the bottom shell.

Furthermore, the sliding piece comprises a first clamping portion, a pulling portion, and at least one limiting rod. The pulling portion is fixedly connected with a bottom portion of the first clamping portion. A first end of the at least one limiting rod is sleeved on the at least one spring. A part of the at least one spring arranged in the at least one limiting rod abuts against the at least one limiting rod. A second end of the at least one limiting rod is fixedly connected with the bottom portion of the first clamping portion.

Furthermore, the at least one through hole extends from a top portion of the first clamping portion to the first end of the limiting rod.

Furthermore, the pulling portion is L-shaped. A first end of the pulling portion is fixedly connected with the bottom portion of the first clamping portion. A second end of the pulling portion is arranged away from the limiting rod.

Furthermore, the pulling portion is fixedly connected with the first clamping portion to form a concave structure.

Furthermore, the clamping plate comprises a fixing plate and a second clamping portion. The fixing plate is fixedly connected with the bottom shell. When the portable streaming media player holder is not in sue, the first clamping portion abuts against the second clamping portion.

Furthermore, at least one spring accommodating groove is defined on the bottom shell. The at least one spring is arranged in the at least one spring accommodating groove.

Furthermore, a plurality of springs are provided, and a plurality of spring accommodating groove are provided.

Furthermore, the sliding assembly comprises at least one spring, at least one guiding rod, and a sliding piece. The sliding piece comprises a first clamping portion, a pulling portion, at least one limiting rod, and at least one through hole running through the sliding piece from top to bottom. The at least one through hole comprises a first through hole and a second through hole. The first through hole is communicated with the second through hole. The first through hole is arranged close to the first clamping portion, and the second through hole is arranged away from the first clamping portion. A central axis of the first through hole coincides with a central axis of the second through hole. An aperture of the second through hole is greater than an aperture of the first through hole.

Furthermore, one end of the at least one spring is arranged in the second through hole.

Furthermore, a first end of the at least one guiding rod is fixedly connected with a bottom portion of the bottom shell. A second end of the at least one guiding rod is arranged in the first through hole.

Furthermore, mounting plates rotatably connected with the second support are arranged on the clamping mechanism. Two clamping blocks are respectively arranged on the mounting plates. A distance between the clamping blocks is adjustable. The two clamping blocks cooperate with each other to clamp the portable streaming media playing device.

Furthermore, receiving grooves are defined on the mounting plates. Each of the clamping blocks is rotatably connected with an edge of a corresponding receiving groove.

Furthermore, anti-slip patterns are arranged on the clamping blocks.

Compared with the prior art, in the present disclosure, by providing the sliding assembly and the clamping plate, the user is able to hold the portable streaming media player holder with one hand and pull the sliding assembly with one finger to make the sliding assembly to slide in the space formed by the bottom shell and the clamping plate, so that the portable streaming media player holder is able to release or clamp the portable streaming media player, which not only makes the portable streaming media player holder applicable to different groups of people, but also improves the convenience of using the portable streaming media player holder.

DETAILED DESCRIPTION

Figure 1:
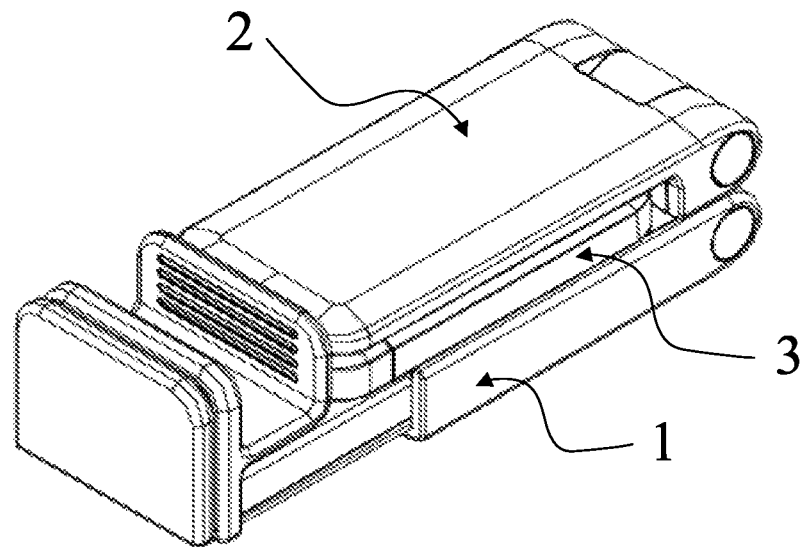
FIG. 1 is a structural schematic diagram of a portable streaming media player holder according to one embodiment of the present disclosure where a first support and a second support are in a folded state.
Figure 2:
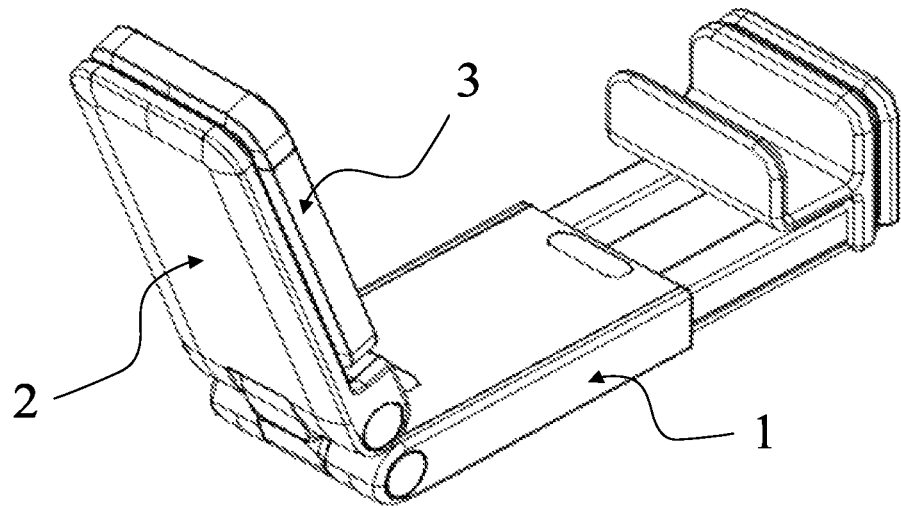
FIG. 2 is a structural schematic diagram of the portable streaming media player holder according to one embodiment of the present disclosure where the first support and the second support are in an open state and a sliding assembly is attached to a clamping plate.
Figure 3:
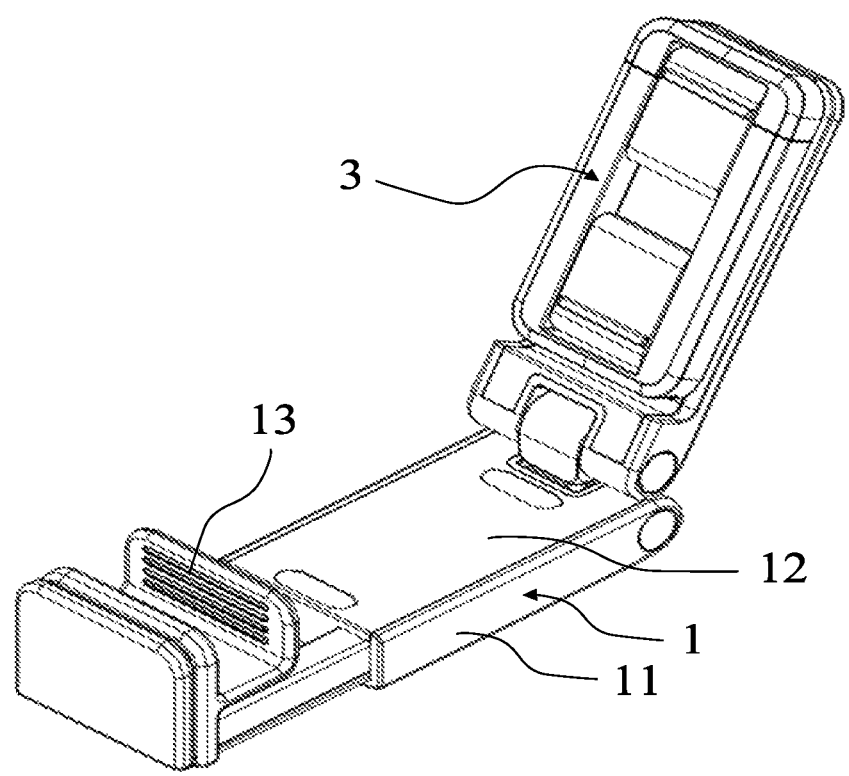
FIG. 3 is another structural schematic diagram of the portable streaming media player holder according to one embodiment of the present disclosure where the first support and the second support are in an open state and a sliding assembly is attached to a clamping plate.

To facilitate a good understanding of purposes, structures, features, and characteristics, etc. of the present disclosure, the portable streaming media player holder of the present disclosure is further described in conjunction with accompanying drawings and specific embodiments.

As shown in FIGS. 1-3 and FIGS. 6-8, the present disclosure provides a portable streaming media player holder. The portable streaming media player holder comprises a first support 1, a second support 2, and a clamping mechanism 3. The first support 1 is connected with the second support 2, and the first support 1 and the second support 2 rotate around a same axis. The second support 2 is rotatably connected with the clamping mechanism 3. The first support 1 comprises a bottom shell 11, a cover plate 12, a sliding assembly 13, and a clamping plate 14. The cover plate 12 is detachably or fixedly arranged on the bottom shell 11. The bottom shell 11 is fixedly connected with the clamping plate 14. The sliding assembly 13 is accommodated in a space formed by the bottom shell 11 and the clamping plate 14. The sliding assembly 13 is movably connected with the clamping plate 14.

In the embodiment, the first support 1 and the second support 2 are movably connected by a first rotating piece. The present disclosure hereby takes the portable streaming media player holder placed in a portrait orientation as an example. The first support 1 and the second support 2 are rotatable by 360 degrees around a same horizontal axis, or the first support 1 and the second support 2 are rotatable by 360 degrees around a same vertical axis. The second support 2 and the clamping mechanism 3 are movably connected by a second rotating piece, and the clamping mechanism 3 is rotatable 360 degrees around an axis of the second rotating piece.

The cover plate 12 is detachably arranged on the bottom shell 11. The cover plate 12 is fixed to the bottom shell 11 through fasteners. Of course, in other embodiment, the cover plate 12 is detachably arranged on the bottom shell 11 by other means. For example, two ends of the cover plate 12 are snapped on the bottom shell 11. Alternatively, a first end of the cover plate 12 is connected with the bottom shell 11 by a pin, and a second end of the cover plate 12 is snapped on the bottom shell 11, which is not limited therein. Optionally, the cover plate 12 is fixedly arranged on the bottom shell 11. The cover plate 12 is fixed to the bottom shell 11 through the fasteners. Of course, in other embodiment, the cover plate 12 is fixedly arranged on the bottom shell 11 by other means. For example, the clamping plate 12 is welded to or reverted to the bottom shell 11, which is not limited therein.

The sliding assembly 13 is accommodated in the space formed by the bottom shell 11 and the clamping plate 14 and is slidable in the space. When in use, a user is able to hold the portable streaming media player holder with one hand and then pull the sliding assembly 13 with one finger, so that the sliding assembly 13 moves away from the clamping plate 14. When a distance between the sliding assembly 13 and the clamping plate 14 reaches a required distance, the portable streaming media player holder clamps an object needed to be clamped or the portable streaming media player holder is separated from the object, so that the portable streaming media player holder is able to release or clamp the portable streaming media player. In the portable streaming media player holder of the present disclosure, the uses only need to applied a relative small force to pull the sliding assembly 13 to realized releasing or clamping of the portable streaming media player holder, which not only makes the portable streaming media player holder applicable to different groups of people, but also improves convenience of using the portable streaming media player holder.

As shown in FIGS. 1-4, the sliding assembly 13 comprises springs 131, guiding rods 132, and a sliding piece 133. The sliding piece 133 comprises a first clamping portion 1331, a pulling portion 1332, limiting rods 1333, and through hole running through the sliding piece from top to bottom. A first end of the each of the springs 131 abuts against the bottom shell 11. Each of the through holes comprises a first through hole 136 and a second through hole 137. Each first through hole 136 is close to the first clamping portion 1331. Each second through hole 137 is way from the first clamping portion 1331. A central axis of each first through hole 136 coincides with a central axis of a corresponding second through hole 137. An aperture of each second through hole 137 is greater than an aperture of each first through hole 136. A second end of each of the springs 131 is arranged in a corresponding second through hole 137.

In the embodiment, a step surface 135 is formed at the joint of each first through hole 136 and the corresponding second through hole 137. The second end of each of the springs 131 is accommodated in the corresponding second through hole 137. The sliding assembly 13 limits each of the springs 131 through each step surface 135 in a sliding process, so that the springs 131 are compressed to required positions. Further, each step surface for limiting is defined in each of the through holes, so that a part of each of the springs 131 is accommodated in a corresponding through hole, thereby effectively reducing a length of the portable streaming media player holder.

It should be noted that each of the guiding rods 132 is sleeved in a corresponding spring 131. A first end of each of the guiding rods 132 is fixedly connected with a bottom portion of the bottom shell 11. A second end of each of the guiding rods 132 is arranged in a corresponding first through hole 136.

In the embodiment, the arrangements of the guiding rods 132 ensure that each of the spring 131 moves along a direction of a corresponding guiding rod 132 in the sliding process of the sliding assembly 13, thereby preventing the springs 131 from being distorted in a moving process due to unbalanced stress, and further preventing friction, jamming, etc. between the springs 131 and spring accommodating grooves.

Figure 4:
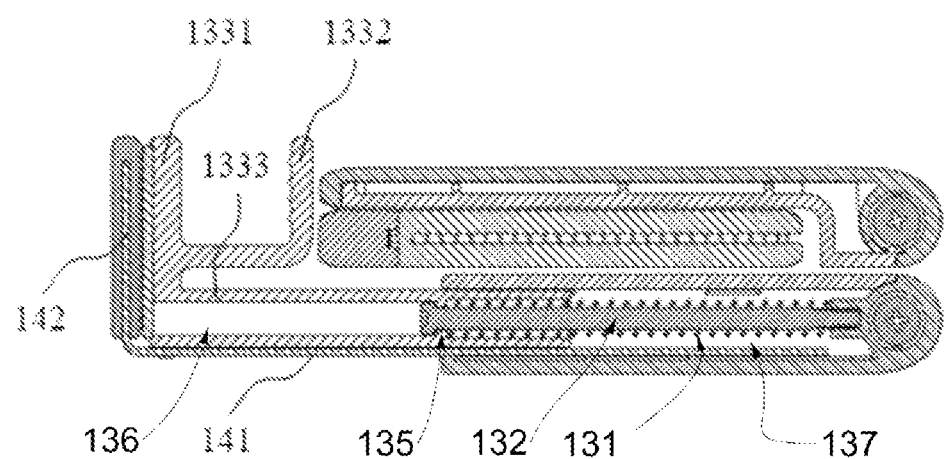
FIG. 4 is a cross-sectional schematic diagram of the portable streaming media player holder of the present disclosure according to one embodiment of the present disclosure.
Figure 5:
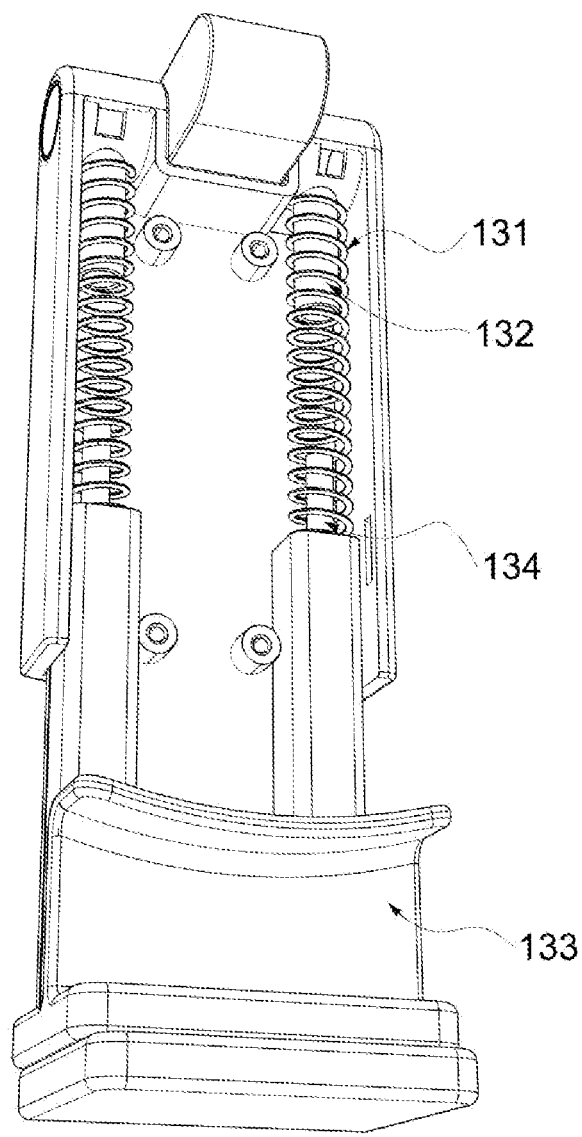
FIG. 5 is a partial schematic diagram of the portable streaming media player holder according to another embodiment of the present disclosure.
Figure 6:
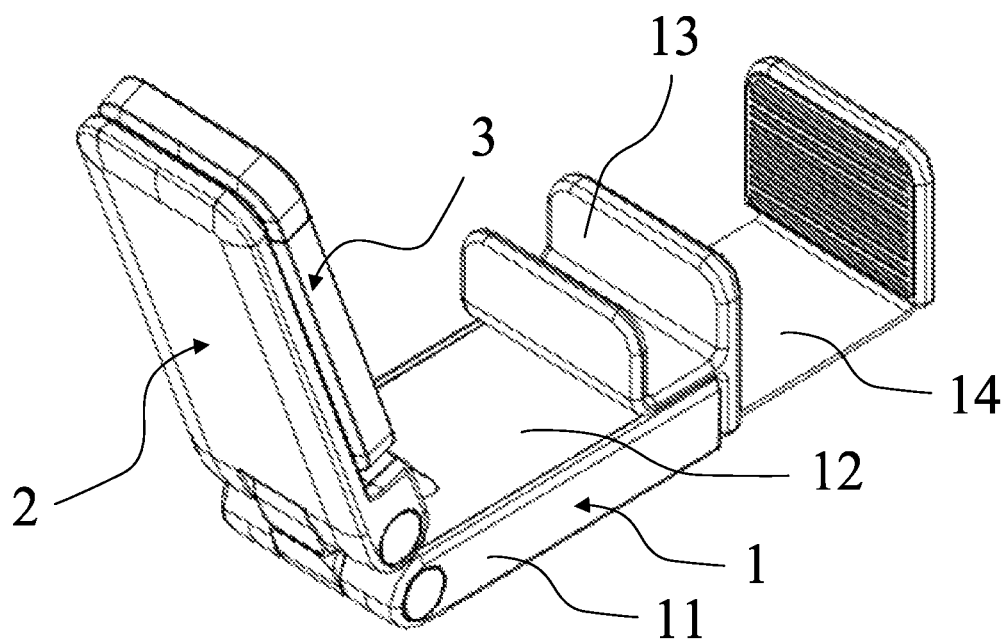
FIG. 6 is a structural schematic diagram of the portable streaming media player holder according to one embodiment of the present disclosure where the first support and the second support are in the open state and the sliding assembly is away from the clamping plate.
Figure 7:
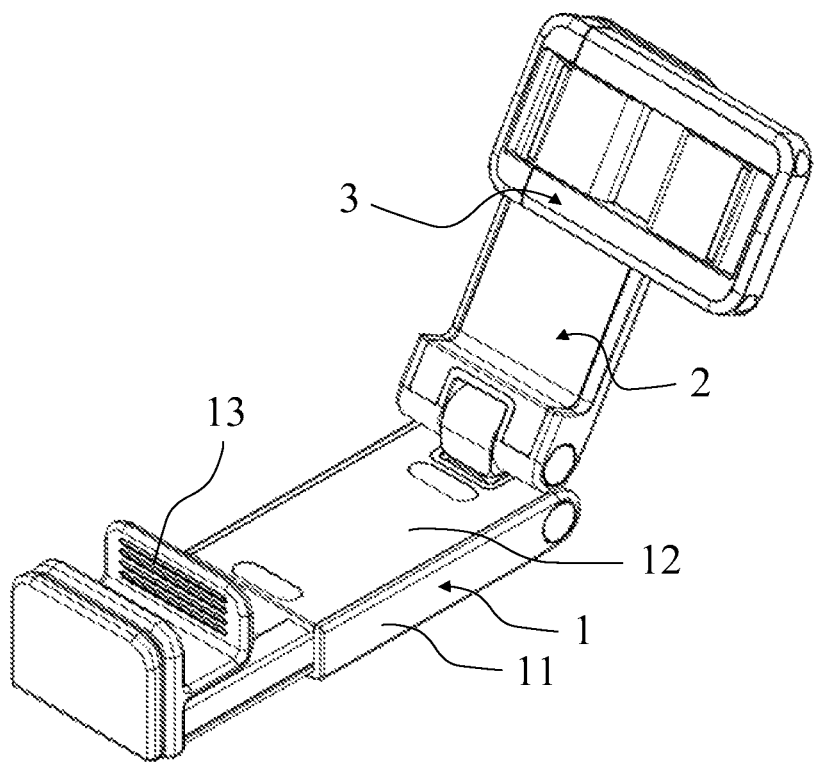
FIG. 7 is a structural schematic diagram of the portable streaming media player holder according to one embodiment of the present disclosure where the first support and the second support are in the open state, the sliding assembly is attached to the clamping plate, and a clamping mechanism is rotated 90 degrees.

As shown in FIG. 4, spring accommodating grooves are defined on the bottom shell 11. The springs are one-to-one arranged in the spring accommodating grooves.

In the embodiment, the spring accommodating grooves facilitate placements of the springs 131, and according to the number of the springs 131, one or more spring accommodating grooves may be correspondingly defined.

As shown in FIGS. 1-4 and 6-7, the pulling portion 1332 is fixedly connected with a bottom portion of the first clamping portion 1331. A first end of each of the limiting rods 1333 is sleeved on a corresponding spring 131. A second end of each of the limiting rods 1333 is fixedly connected with the bottom portion of the first clamping portion 1331. A part of each of the springs 131 arranged in the corresponding limiting rod abuts against the corresponding limiting rod.

In the embodiment, the pulling portion 1332 and the first clamping portion 1331 are integrally formed. Of course, in other embodiments, the pulling portion 1332 and the bottom portion of the first clamping portion 1331 may also be fixedly connected by fasteners, or may be connected by welding or riveting, which is not limited thereto. The first end of each of the limiting rods 1333 abuts against the part of each of the springs 131 arranged in the corresponding limiting rod 1333. The limiting rods 1333 cooperate with the springs 131, and the springs 131 are compressed by the limiting rods 1333, so that the springs 131 are compressed to the required positions. Therefore, the sliding piece 133 is slid to a required position. The limiting rods 1333 and the first clamping portion 1331 are integrally formed. Of course, in other embodiments, the second end of each of the limiting rods 1333 is fixedly connected with the bottom portion of the first clamping portion 1331 by fasteners, welding, or riveting, which is not limited thereto.

Figure 8:
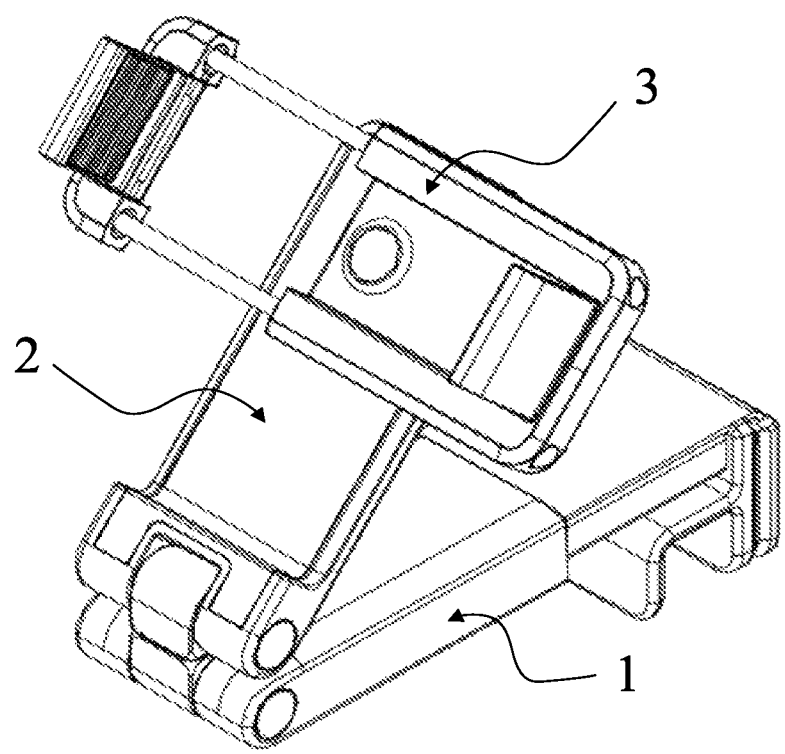
FIG. 8 is another structural schematic diagram of the portable streaming media player holder according to one embodiment of the present disclosure where the first support and the second support are in the open state, the sliding assembly is attached to the clamping plate, and the clamping mechanism is rotated 90 degrees.

As shown in FIG. 8, two clamping blocks configured to clamp the portable streaming media player are arranged on the clamping mechanism 3. The two clamping blocks cooperate with each other and a distance between the two clamping blocks is adjustable to adapt to portable streaming media player of different sizes and shapes.

In the embodiment, mounting plates rotatably connected with the second support are arranged on the clamping mechanism 3. The two clamping blocks are arranged on the mounting plates. The two clamping blocks cooperate with each other to clamp the portable streaming media player. Receiving grooves are defined on the mounting plates. Each of the clamping blocks is rotatably connected with an edge of a corresponding receiving groove. When the clamping blocks are not in use, the clamping blocks are respectively accommodated in the receiving groove. Anti-slip patterns are arranged on the clamping blocks, so that the portable streaming media player is stably clamped.

Specifically, two mounting plate are provided. The two clamping blocks are arranged on different mounting plates. A sliding structure same as the sliding assembly 13 is arranged between the two mounting plates, so that the two clamping blocks stably clamp the portable streaming media player.

As shown in FIGS. 1-4, each of the through holes extends from a top portion of the first clamping portion 1331 to the first end of a corresponding limiting rod 1333 away from the first clamping portion 1331.

In the embodiment, each of the through holes is configured to accommodate a corresponding guiding rod 132, so that the guiding rods 132 move along with the sliding piece 133, thus ensuring that the second end of each of the springs 131 is fixed at a corresponding position and avoiding unnecessary position movements of the springs 131.

As shown in FIGS. 1-4, the pulling portion 1332 is L-shaped. A first end of the pulling portion 1332 is fixedly connected with the bottom portion of the first clamping portion 13331. A second end of the pulling portion 1332 is arranged away from the limiting rods 1333.

In the embodiment, the pulling portion 1332 is fixedly connected with the first clamping portion to from a concave structure. The use can put the finger in the concave structure. The pulling portion 1332 is L-shaped, which is ergonomic and easy for the user to pull the sliding piece 133.

As shown in FIG. 4, the clamping plate 14 comprises a fixing plate 141 and a second clamping portion 142. The fixing plate 141 is fixedly connected with the bottom shell 11. When the portable streaming media player holder is not in sue, the first clamping portion 1331 abuts against the second clamping portion 142.

In the embodiment, the fixing plate 141 and the bottom shell 11 are fixedly connected by fasteners. Of course, in other embodiments, the fixing plate 141 and the bottom shell 11 are fixedly connected by other connection methods, such as by welding or riveting, etc., which is not limited thereto. During a process that the user pulls the sliding assembly 13 with one finger, the first clamping portion 1331 moves away from the second clamping portion 142. Movement, when a distance between the first clamping portion 1331 and the second clamping portion 142 reaches a required distance, the portable streaming media player holder clamps an object needed to be clamped or the portable streaming media player holder is separated from the object, so that the portable streaming media player holder is able to release or clamp the portable streaming media player.

In another embodiment, as shown in FIGS. 1-3 and 5, the sliding assembly 13 comprises the springs 131, the guiding rods 132, the sliding piece 133, and spring fixing shafts 134. The guiding rods are arranged on the bottom portion of the bottom shell 11. Each of the guiding rods 132 is inserted into a corresponding spring 131. The through holes running through the sliding piece 133 from top to bottom is defined on the sliding piece 133. The guiding rods are hollow and are of a pipe shape. An inner wall diameter of each of the guiding rods 132 is greater than a diameter of each of the spring fixing shafts 134, so that each of the spring fixing shafts 134 is insertable into a corresponding guiding rod 132. A first end of each of the springs 131 abuts against the bottom portion of the bottom shell 11.

In the embodiment, each of the spring fixing shaft 134 passes through a corresponding through hole to abut against a second end of each of the springs 131. thus ensuring that the second end of each of the springs 131 is fixed at a corresponding position and avoiding unnecessary position movements of the springs 131.

In one optional embodiment, the portable streaming media player is a cell phones, a tablet, or a portable tablet-like device. Of course, in other embodiments, the portable streaming media player may be an electronic device of other shapes, such as a polygonal electronic device, a round electronic devices, a prismatic electronic device, etc., which is not limited thereto.

In summary, in the present disclosure, by providing the sliding assembly and the clamping plate, the user is able to hold the portable streaming media player holder with one hand and pull the sliding assembly with one finger to make the sliding assembly to slide in the space formed by the bottom shell and the clamping plate, so that the portable streaming media player holder is able to release or clamp the portable streaming media player, which not only makes the portable streaming media player holder applicable to different groups of people, but also improves the convenience of using the portable streaming media player holder.

The above detailed description is merely illustrative of optional embodiments of the present disclosure, and is not intended to limit the scope of the present disclosure. Therefore, any equivalent technical changes made using the present specification and the drawings are all included within the scope of the present disclosure.

What is claimed is:

1. A portable streaming media player holder; comprising:
a first support,
a second support, and
a clamping mechanism;
wherein the first support is rotatably connected with the second support; the first support and the second support rotate around a same axis; the second support is rotatably connected with the clamping mechanism; the first support comprises a bottom shell, a cover plate, a sliding assembly, and a clamping plate; the cover plate is detachably or fixedly arranged on the bottom shell; the bottom shell is fixedly connected with the clamping plate; the sliding assembly is accommodated in a space formed by the bottom shell and the clamping plate; the sliding assembly is movably connected with the clamping plate.

2. The portable streaming media player holder according to claim 1, wherein the sliding assembly comprises at least one spring, at least one guiding rod, a sliding piece, and at least one spring fixing shaft; the at least one guiding rod is inserted into the spring; at least one through hole running through the sliding piece from top to bottom is defined on the sliding piece; a first end of the at least one spring abuts against a bottom portion of the bottom shell; the at least one spring fixing shaft passes through the at least one through hole to abut against a second end of the at least one spring.

3. The portable streaming media player holder according to claim 1, wherein two ends of the cover plate are snapped on the bottom shell.

4. The portable streaming media player holder according to claim 1, wherein a first end of the cover plate is connected with the bottom shell by a pin, and a second end of the cover plate is snapped on the bottom shell.

5. The portable streaming media player holder according to claim 1, wherein the clamping plate and the bottom shell are fixedly connected through fasteners.

6. The portable streaming media player holder according to claim 1, wherein the clamping plate is welded to the bottom shell.

7. The portable streaming media player holder according to claim 1, wherein the clamping plate is reverted to the bottom shell.

8. The portable streaming media player holder according to claim 2, wherein the sliding piece comprises a first clamping portion, a pulling portion, and at least one limiting rod; the pulling portion is fixedly connected with a bottom portion of the first clamping portion; a first end of the at least one limiting rod is sleeved on the at least one spring; a part of the at least one spring arranged in the at least one limiting rod abuts against the at least one limiting rod; a second end of the at least one limiting rod is fixedly connected with the bottom portion of the first clamping portion.

9. The portable streaming media player holder according to claim 8, wherein the at least one through hole extends from a top portion of the first clamping portion to the first end of the limiting rod.

10. The portable streaming media player holder according to claim 8, wherein the pulling portion is L-shaped; a first end of the pulling portion is fixedly connected with the bottom portion of the first clamping portion; a second end of the pulling portion is arranged away from the limiting rod.

11. The portable streaming media player holder according to claim 10, wherein the pulling portion is fixedly connected with the first clamping portion to form a concave structure.

12. The portable streaming media player holder according to claim 8, wherein the clamping plate comprises a fixing plate and a second clamping portion; the fixing plate is fixedly connected with the bottom shell; when the portable streaming media player holder is not in sue, the first clamping portion abuts against the second clamping portion.

13. The portable streaming media player holder according to claim 2, wherein at least one spring accommodating groove is defined on the bottom shell; the at least one spring is arranged in the at least one spring accommodating groove.

14. The portable streaming media player holder according to claim 13, wherein a plurality of springs are provided, and a plurality of spring accommodating groove are provided.

15. The portable streaming media player holder according to claim 1, wherein the sliding assembly comprises at least one spring, at least one guiding rod, and a sliding piece; the sliding piece comprises a first clamping portion, a pulling portion, at least one limiting rod, and at least one through hole running through the sliding piece from top to bottom; the at least one through hole comprises a first through hole and a second through hole; the first through hole is communicated with the second through hole; the first through hole is arranged close to the first clamping portion; the second through hole is arranged away from the first clamping portion; a central axis of the first through hole coincides with a central axis of the second through hole; an aperture of the second through hole is greater than an aperture of the first through hole.

16. The portable streaming media player holder according to claim 15, wherein one end of the at least one spring is arranged in the second through hole.

17. The portable streaming media player holder according to claim 16, wherein a first end of the at least one guiding rod is fixedly connected with a bottom portion of the bottom shell; a second end of the at least one guiding rod is arranged in the first through hole.

18. The portable streaming media player holder according to claim 1, wherein mounting plates rotatably connected with the second support are arranged on the clamping mechanism; two clamping blocks are respectively arranged on the mounting plates; a distance between the clamping blocks is adjustable; the two clamping blocks cooperate with each other to clamp the portable streaming media playing device.

19. The portable streaming media player holder according to claim 18, wherein receiving grooves are defined on the mounting plates; each of the clamping blocks is rotatably connected with an edge of a corresponding receiving groove.

20. The portable streaming media player holder according to claim 18, wherein anti-slip patterns are arranged on the clamping blocks.

\* \* \* \* \*